(12) United States Patent
Pallotta

(10) Patent No.: US 8,049,564 B2
(45) Date of Patent: Nov. 1, 2011

(54) DISTRIBUTED ACTIVE TRANSFORMER AMPLIFIER WITH DIFFERENTIAL POWER COMBINER

(75) Inventor: Andrea Pallotta, Rho (IT)

(73) Assignee: STMicroelectronics S.r.l., Agrate Brianza (MI) (IT)

( * ) Notice: Subject to any disclaimer, the term of this patent is extended or adjusted under 35 U.S.C. 154(b) by 0 days.

(21) Appl. No.: 12/648,163

(22) Filed: Dec. 28, 2009

(65) Prior Publication Data

US 2010/0164628 A1   Jul. 1, 2010

(30) Foreign Application Priority Data

Dec. 30, 2008   (IT) ............................. TO2008A1010

(51) Int. Cl.
    *H03F 3/26*    (2006.01)
(52) U.S. Cl. ........................................ 330/276; 330/286
(58) Field of Classification Search .......... 330/275–276,
    330/295, 262, 124 R, 301–302, 84, 286; 333/25–26
    See application file for complete search history.

(56) References Cited

U.S. PATENT DOCUMENTS

| 6,816,012 | B2 | 11/2004 | Aoki et al. | |
| 7,425,869 | B2 * | 9/2008 | Aoki et al. | 330/276 |
| 7,675,365 | B2 * | 3/2010 | Lee et al. | 330/295 |
| 7,746,174 | B2 * | 6/2010 | Yang et al. | 330/295 |

OTHER PUBLICATIONS

European Search Report dated May 10, 2010 from corresponding European application No. 09129210.
European Search Opinion dated May 10, 2010 from corresponding European application No. 09129210.
Cheung T.S.D. et al., A 21-26-GHz SiGe Bipolar Power Amplifier MMIC, IEEE Journal of Solid-State Circuits, IEEE Service Center, Piscataway, NJ, US LINKD-DOI:101109/JSSC.2005.857424, Dec. 1, 2005, pp. 2583-2597, XP002443340.
Jeon et al., A *2.7-kW, 29-MHz Class-E/F$_{odd}$Amplifier with a Distributed Active Transformer*, 2005 IEEE MTTS International Microwave Symposium, Piscataway, JH, IEEE Jun. 12, 2005, pp. 1927-1930, XP010844934.
Lee, O. et al, *A 1.8-GHz 2-Watt Fully Integrated CMOS Push-Pull Parallel-Combined Power Amplifier Design*, Radio Frequency Interated Circuits (RFIC) Symposium , 2007 IEEE, Piscataway, JH, Jun. 1, 2007, pp. 435-438, XP031113065.
Italian Search Report dated Aug. 20, 2009, from corresponding Italian application No. TO2008A001010.
Lee, O. et al, *A 1.8-GHz 2-Watt Fully Integrated CKOS Push-Pull Parallel-Combined Power Amplifier Design*, Radio Frequency Interated Circuits (RFIC) Symposium , 2007 IEEE, Piscataway, JH, Jun. 1, 2007, pp. 435-438, XP031113065.

(Continued)

*Primary Examiner* — Hieu Nguyen
(74) *Attorney, Agent, or Firm* — Lisa K. Jorgenson; William R. McClellan; Wolf, Greenfield & Sacks, P.C.

(57) ABSTRACT

A power amplifier formed by a plurality of pairs of transistors, each pair including a first transistor and a second transistor having each a respective input terminal and a respective output terminal. The output terminals of the first and second transistors of each pair are connected to an output distributed active transformer connected to a differential output of the power amplifier. The input terminals of the first and second transistors of each pair are connected to an input distributed active transformer connected to an input of the power amplifier.

19 Claims, 5 Drawing Sheets

OTHER PUBLICATIONS

Aoki, I et al., *A Fully-Integrated Quad-Band GSM/GPS CMOS Power Amplifier*, IEEE Journal of Solid-State Circuits, IEEE Service Center, Piscataway, NJ, vol. 43, No. 12, Dec. 1, 2008, pp. 2747-2758, XP011238643.

Kim, Seungwoo, et al., *An Optimized Design of Distributed Active Transformer*, IEEE Transactions on Microwave Theory and Techniques, vol. 53, No. 1, Jan. 2005, pp. 308-388.

Akoi, Ichiro, et al., *Distributed Active Transformer—A New Power-Combining and Impedance-Transformation Technique*, IEEE Transactions on Microwave Theory and Techniques, vol. 50, No. 1, Jan. 2002, pp. 316-331.

Aoki, Ichiro et al., *Fully Integrated CMOS Power Amplifier Design Using the Distributed Active-Transformer, Architecture*, IEEE Journal of Solid-State Circuits, vol. 37, No. 3, Mar. 2002, pp. 371-383.

* cited by examiner

DISTRIBUTED ACTIVE TRANSFORMER AMPLIFIER WITH DIFFERENTIAL POWER COMBINER

CROSS REFERENCE TO RELATED APPLICATIONS

This application claims the priority benefit of Italian patent application number TO2008A001010, filed on Dec. 30, 2008, entitled "DISTRIBUTED ACTIVE TRANSFORMER AMPLIFIER WITH DIFFERENTIAL POWER COMBINER," which is hereby incorporated by reference to the maximum extent allowable by law.

BACKGROUND OF THE INVENTION

1. Field of the Invention

The present invention relates to a distributed active transformer (DAT) amplifier with fully differential power combiner.

2. Discussion of the Related Art

Power combiners have particular application in the field of radiofrequency power amplifiers, thanks to the characteristic of in-phase summing the output powers of each individual transistor, maintaining the gain and reducing the voltage thereof at the output terminals.

As is known, in fact, the radiofrequency power amplifier for wireless mobile telecommunications is certainly the most complicated circuit to design using a silicon substrate and using a CMOS compatible process. The reasons for this difficulty are basically two:

1. the breakdown voltages of the gate oxide of the MOS transistor enable rather low RF output powers to be reached; and
2. the quality factor (Q) of the passive elements integrated in the silicon substrate is not suitable for obtaining the high gains and the impedance transformations required by the application specifications of the maximum RF output power.

With the aim of solving the above difficulties, U.S. Pat. No. 6,816,012 and the articles: I. Aoki et al., "Distributed Active Transformer—A new power-combining and impedance-transformation technique", IEEE Trans. Microwave Theory Tech., Vol. 50, No. 1, January 2002; and I. Aoki et al., "Fully Integrated CMOS PA Design using DAT architecture", IEEE J. Solid-State Circuits, Vol. 37, No. 3, March 2002 describe a new architecture of impedance transformer and simultaneous power combiner.

FIG. 1 shows the schematic structure of this amplifier 1, comprising four pairs 2 of transistors 3, 4, of an NMOS type, the transistors 3, 4 of each pair 2 having output terminals (drain) connected to four primaries 10 of a distributed active transformer (DAT) 15, proposed herein. The transistors 3, 4 connected across a same primary 10 form a circuit in push-pull configuration.

The primaries 10 are formed by four slabs, here rectangular, each at 90° with respect to the two adjacent slabs so as to extend approximately like the sides of a square. A secondary 16 of the DAT 15 is formed by a region extending substantially along the sides of a square, inside the primaries 10, and a side thereof (on the right in the drawing) is interrupted approximately in the middle and is connected to a pair of outputs 18, supplying a differential output voltage Vo.

The intermediate taps of the primaries 10 are connected to a supply voltage VDD. The transistors 3, 4 of each pair 2 are connected, via the drain terminals, between pairs of adjacent primaries 10 and receive, on the respective gate terminals (which define respective input terminals), voltages of opposite sign. The common node between the source terminals of the two transistors 3, 4 of each pair is grounded.

Tuning capacitors 7 extend between the drain terminals of each pair 2 of transistors 3, 4.

In the known scheme, the secondary 16 of the transformer combines in series, via magnetic induction, the differential signal of the primaries 10 and sends it to the output 18. The advantages of this known transformer structure are the following:

- the inductances with high quality factor Q are provided by metal strips instead of by spiral inductors, typically with low Q in the standard CMOS processes;
- the transformer ratio of each individual transformer is very low, in other words the ratio is 1:1, and consequently it is simple to obtain and inherently has low ohmic losses;
- the total transformer ratio required for increasing the output power of each single pair of MOS transistors is obtained via the in series combination of the voltage induced magnetically on the secondary 16; in FIG. 1, this ratio is 1:4.

FIG. 2 shows a practical embodiment of the structure object of U.S. Pat. No. 6,816,012 referred to above, in particular in the case of a 2.4-GHz power amplifier having an output power of 1.9 W at a 2 V supply.

As may be noted, the amplifier 1 has a double star structure 20 for biasing the gate terminals of the transistors 3, 4. The double star structure 20 is formed within the secondary 16 in order to contain the ohmic losses as much as possible and consequently reduce the lengths of the metal paths. In detail, the double star structure 20 is formed by a first and a second star regions 20a 20b, formed on two separate metal levels and having each four arms 21a, 21b. The arms 21a of the first star region 20a are connected to the transistors 3, and the arms 21b of the second star region 20b are connected to the transistors 4. In particular, each arm 21a, 21b is connected to a respective transistor 3, 4 via wire connections or further metal levels (represented schematically and designated by 22) that extend under or over the secondary 16. Each star region 20a, 20b further comprises a respective input arm 22a, 22b, connected to an input transformer 25 arranged outside the DAT amplifier 1 and having input terminals receiving a supply voltage Vi and output terminals connected each to a respective input arm 22a, 22b through wire connections or metal lines 26 extending over or under the secondary 16 (and possibly over or under one of the primaries 10).

The gate terminals of the transistors 3, 4 are biased through appropriate biasing regions 28, which are substantially L-shaped, the central tap whereof is a signal virtual ground.

This structure reaches, up to now, the highest power value by using NMOS transistors formed using standard CMOS process, but is not free from disadvantages.

The circular structure of the secondary 16 (which combines the output powers of the pairs of transistors 3, 4) renders in fact very complicated the design of the network needed for connecting the gate terminals of the transistors 3, 4. In fact:

It is difficult to form the network for distributing the RF signal through the double star structure 20 such so as to reduce the parasitic components of resistance, inductance, and capacitance. Therefore, the maximum use frequencies of the DAT 15 and consequently the possible applications are markedly limited;

The input impedance matching network to obtain maximum power transfer to the gate terminals of the transistors 3, 4 is difficult to design in particular for wide frequency bandwidths;

The connection network (double star structure 20) is formed within the secondary 16 of the DAT 15, where the magnetic intensity flux is high. It is consequently very complicated to control coupling between the output and input RF power with consequent problems of stability and oscillation risk; in fact, the star structure is magnetically coupled to the secondary 16 and generates feedback that can cause oscillations;

Extending the double star structure 20 to applications at high frequencies up to the millimetric range becomes impracticable.

The aim of the present invention is thus to provide an amplifier of the DAT type that overcomes the drawbacks of the prior art.

SUMMARY OF THE INVENTION

According to the present invention, there is provided a power amplifier comprising a power amplifier comprising a plurality of pairs of transistors, each pair comprising a first and a second transistors having each a respective input terminal and a respective output terminals; the output terminals of the first and second transistors of each pair being connected to an output distributed active transformer coupled to a differential output of the power amplifier, characterized in that the input terminals of the first and second transistors of each pair are connected to an input distributed active transformer coupled to an input of the power amplifier.

BRIEF DESCRIPTION OF THE DRAWINGS

For a better understanding of the present invention, preferred embodiments thereof are now described, purely by way of non-limiting example, with reference to the attached drawings, wherein:

FIG. 3 shows an amplifier 30 of the fully differential power type, with dual distributed active transformer (DDAT). In practice, the amplifier 30 has, in addition to an output DAT 32 similar to the DAT 15 of FIG. 1, an input DAT 31, specular to and such as to surround or enclose the output DAT 32. The amplifier 30 forms a differential dual distributed active transformer (DDDAT) amplifier.

Figure 1:
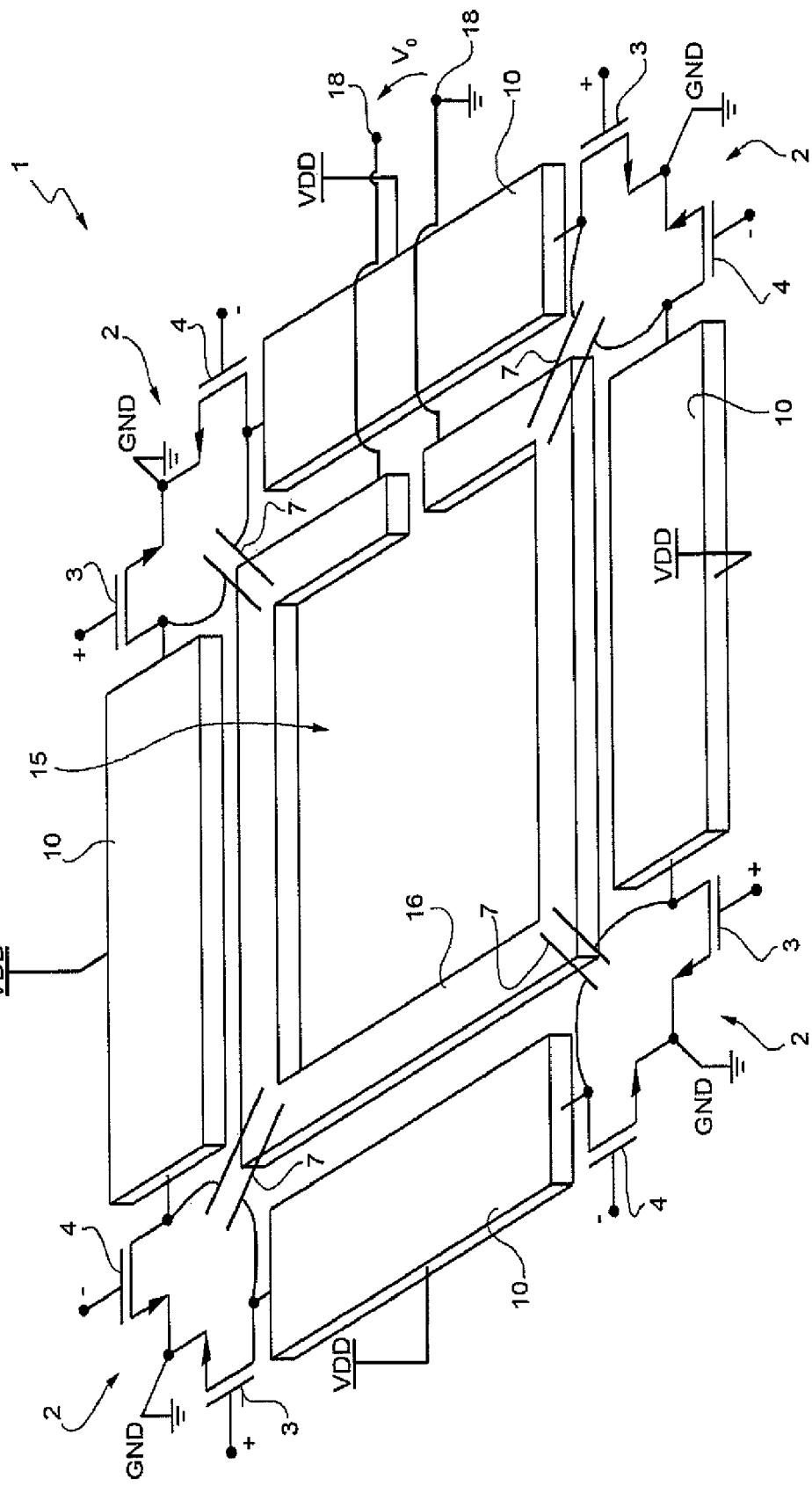
FIG. 1 is a perspective principle view of a known DAT amplifier.
Figure 2:
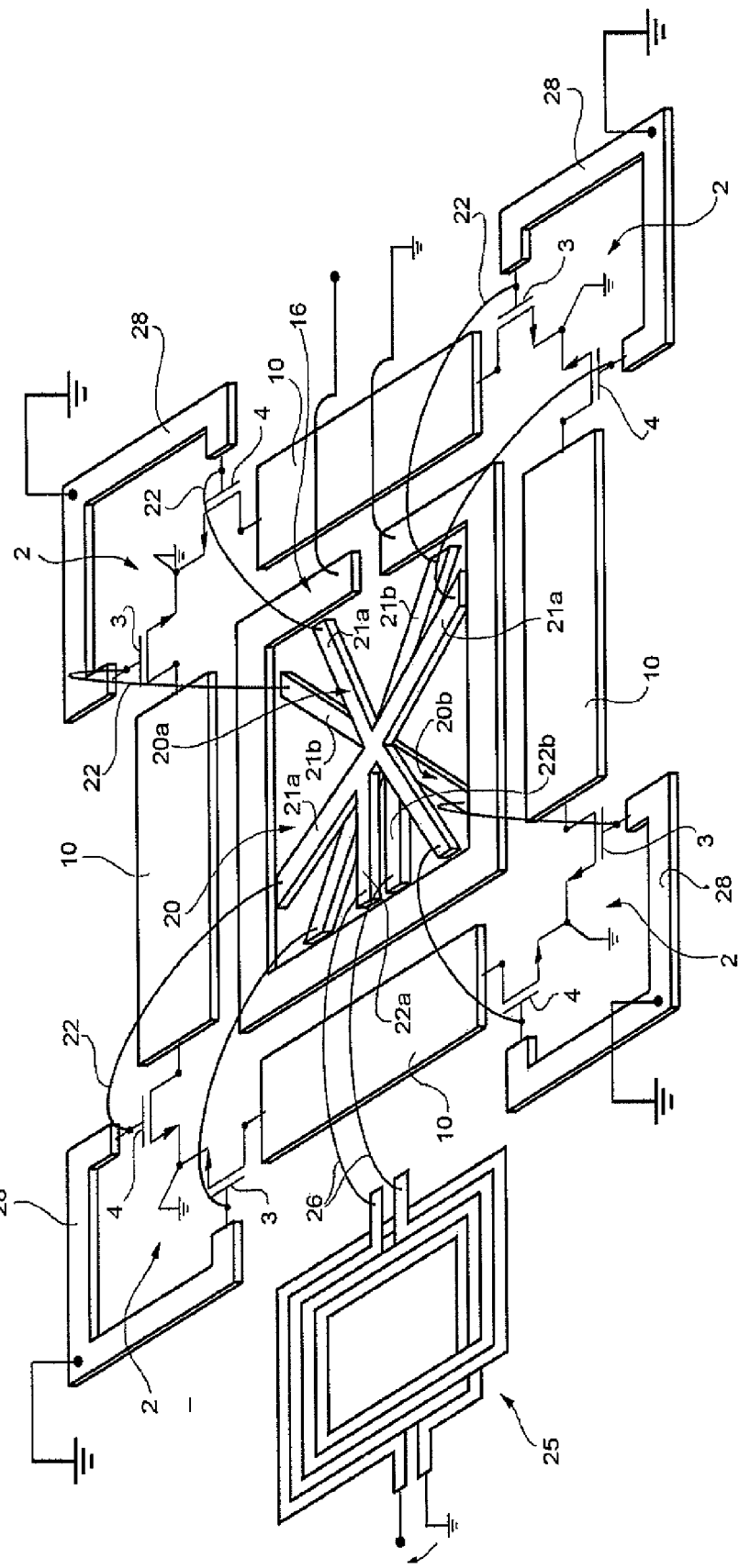
FIG. 2 is a perspective view of an embodiment of the amplifier of FIG. 1.

The input DAT 31 comprises a metal region, forming an input primary 35, and a plurality of slab inductors, forming input secondaries 36.

In the embodiment shown, the input primary 35 extends along the sides of a square having an open side and connected to input terminals 37 receiving a differential input signal Vi. The input secondaries 36 are arranged facing the input primary 35, each arranged parallel to and at a distance from a respective side of the input primary 35. Each input secondary 36 is thus formed by a slab having its end connected to the gate terminals of first and second transistors 40, 41, similar to the transistors 3, 4 of FIG. 1 and forming pairs 39 of transistors, wherein which the transistors 40, 41 connected to a same input secondary 36 are in push-pull configuration. Also here, the transistors 40, 41 are of an NMOS type, but may also be obtained using a different technology.

In detail, each input secondary 36 is connected with an own end to the gate terminal of a respective first transistor 40 of one pair 39 and with a second end to the gate terminal of a respective second transistor 41 of an adjacent pair 39. Each input secondary 36 has an intermediate tap biased at a dc voltage VGG, as may be seen more clearly in FIG. 4.

The output DAT 32 is formed inside the input DAT 31 and comprises an output secondary 45 similar to the secondary 16 of FIG. 1 and four output primaries 46 similar to the primaries 10 of FIG. 1. The output primaries 46 are connected to the first and second transistors 40, 41, analogously to FIG. 1 for transistors 3, 4.

The input DAT 31 and the output DAT 32 have the same center and the same diagonals as the square formed by the output secondary 16. In addition, the open side of the output secondary 45 is connected to output terminals 48 and is opposite to the side of the input primary 35 connected to the input terminals 37.

Figure 4:
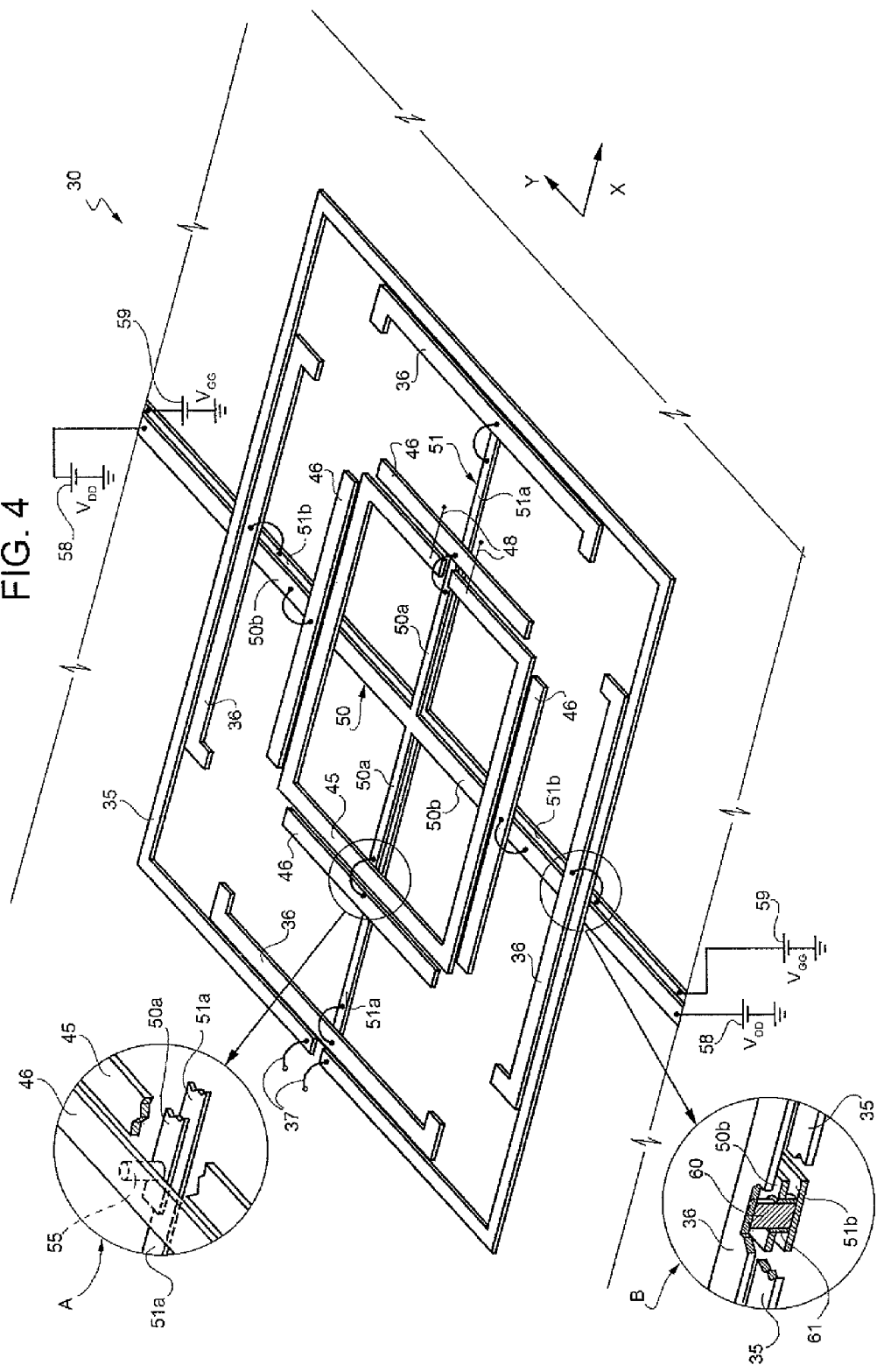
FIG. 4 is a perspective view of an embodiment of the amplifier of FIG. 3.

FIG. 4 shows the spatial arrangement of the amplifier 30. As may be noted, the input DAT 31 and output DAT 32 are formed here in a same metal level. The intermediate taps of the output secondaries 46 are connected to an output biasing structure 50 formed in a metal level lower than that of the transformers 31, 32, and the intermediate taps of the input secondaries 36 are connected to an input biasing structure 51 formed in a metal level lower than that of the output biasing structure 50.

In detail, the output biasing structure 50 is formed by a cross having a first arm 50a extending in a first direction (parallel to the axis X), perpendicular to the sides of the square connected to the input and the output terminals 37, 48, and a second arm 50b, perpendicular to the first arm 50a and extending in a direction parallel to the axis Y. The second arm 50b of the output biasing structure 50 receives a dc supply voltage VDD, as represented schematically by the voltage generators 58.

The input biasing structure 51 is formed by a cross having a first arm 51a extending parallel to the direction X, vertically aligned to and extending underneath the first arm 50a of the output biasing structure 50, and a second arm 51b, perpendicular to the first arm 51a and vertically aligned to the second arm 50b of the output biasing structure 50. The second arm 51b of the input biasing structure 51 receives a dc supply voltage VGG, as represented schematically by the voltage generators 56. The first arm 50a of the output biasing structure 50 is shorter than the first arm of the input biasing structure 51, which is extended beyond the arm 50a so as to provide the electrical connection between the first arm 51a of the input biasing structure 51 and the input secondary 36, as shown in the detail A.

In particular, the connection between the first arms 50a and 51a of the output biasing structure 50 and of the input biasing structure 51, respectively, and the intermediate taps of the output secondaries 46 (which extend in the direction Y) of two input secondaries 36, respectively, may be obtained with a simple via, filled with metal 55, as shown in the enlarged detail A. Instead, the connection between the second arm 51b of the input biasing structure 51 and the intermediate taps of two input secondaries 36, which extend in the direction X, of the output biasing structure 50 requires crossing over of the second arm 50b, as shown in the enlarged detail B. To this end, the second arm 50b has two openings (one for each end), and a plug 60 extends therethrough. An insulating region 61 surrounds the plug 60 at least at the height of the second arm 50b of the output biasing structure 50, to prevent any direct connection between them.

The amplifier 30 operates in a way similar to the known transformer, but is characterized in that the distribution of the RF signal on the inputs of the transistors 40, 41 occurs via magnetic induction and not by direct connection.

The amplifier 30 described herein has numerous advantages, among which:

Considerable simplification in the design of the network for distributing the RF signal to the gate terminals of the transistors 40, 41. The parasitic parameters of resistance, inductance, and capacitance can be kept under control during the design step so as not to introduce any limitation to the operating frequencies and consequently to the potential applications of the amplifier 30;

Considerable simplification in the design of the network for dc biasing the gate and drain terminals of the transistors 40, 41, thanks to the biasing structures 50, 51, as highlighted in FIG. 4, exploiting the ac signal "virtual ground" in the intermediate taps of the input secondaries 36 and of the output primaries 46;

Pure input and differential output structure of the amplifier, with consequent disturbance immunity, gain doubling, presence of virtual masses, and matching to the preamplification circuit arranged at the input of the DDDAT amplifier and generally having a differential output;

The dominant electrical parameter seen from the input terminals 37 is the inductance of the input primary 35, which consequently is easily compensated for by inserting a parallel capacitance (not shown). For the same reason the possible design of a wide band input matching network is considerably simplified;

The metal paths for connecting the inputs of the transistors 40, 41 of the input secondaries 36 do not extend within the output transformer 32, consequently reducing the magnetic back coupling between the output and the input and thus reducing the risk of oscillations;

Possibility of controlling, during the design step, the stability parameters of the amplifier 30, thereby eliminating oscillation risks. In particular, the distance between the input secondaries 36 and the output primaries 46 can be easily chosen so as to achieve a good compromise between the stability of the amplifier 30 and its maximum gain;

Compactness in the overall dimensions of the input DAT 31 and thus of the entire amplifier 30, since the input DAT 31 encloses the transistors 40, 41, the tuning capacitors (not shown), and the output DAT 32;

Possibility of obtaining shape factors different from the shown square shape, i.e., of providing hexagonal, octagonal structures, and so forth, once again with pairs of transistors 40, 41 in push-pull configuration connected at the vertices of a geometrical figure. Thereby, the triple effect is obtained of combining greater RF power at output, reducing the maximum voltage across the transistors 40, 41, increasing the reliability thereof, and maintaining efficiency and simplicity in the connections;

Maintenance of all the advantages of the known DAT structure;

Simplicity of design and of manufacture, which does not require complex or critical implementation steps.

Figure 3:
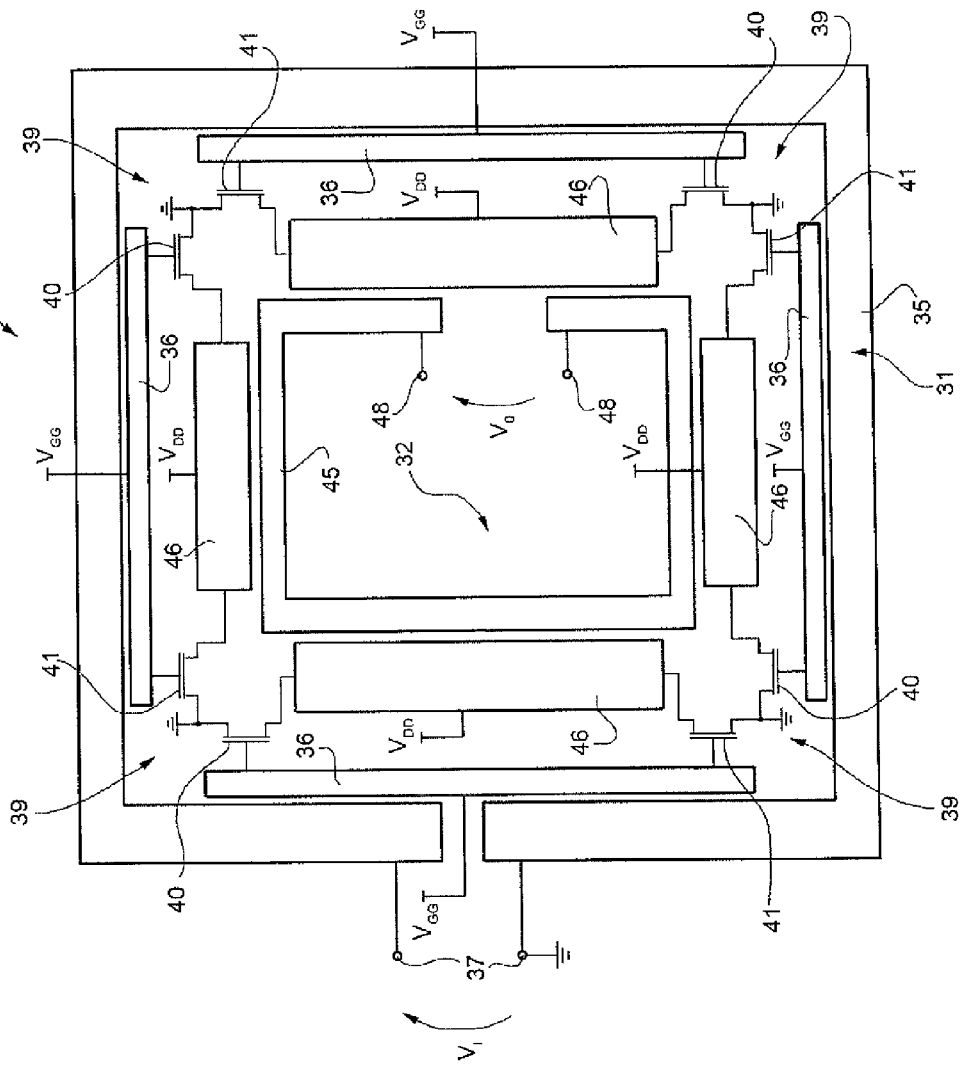
FIG. 3 is a top plan view of a power amplifier according to one embodiment.
Figure 5:
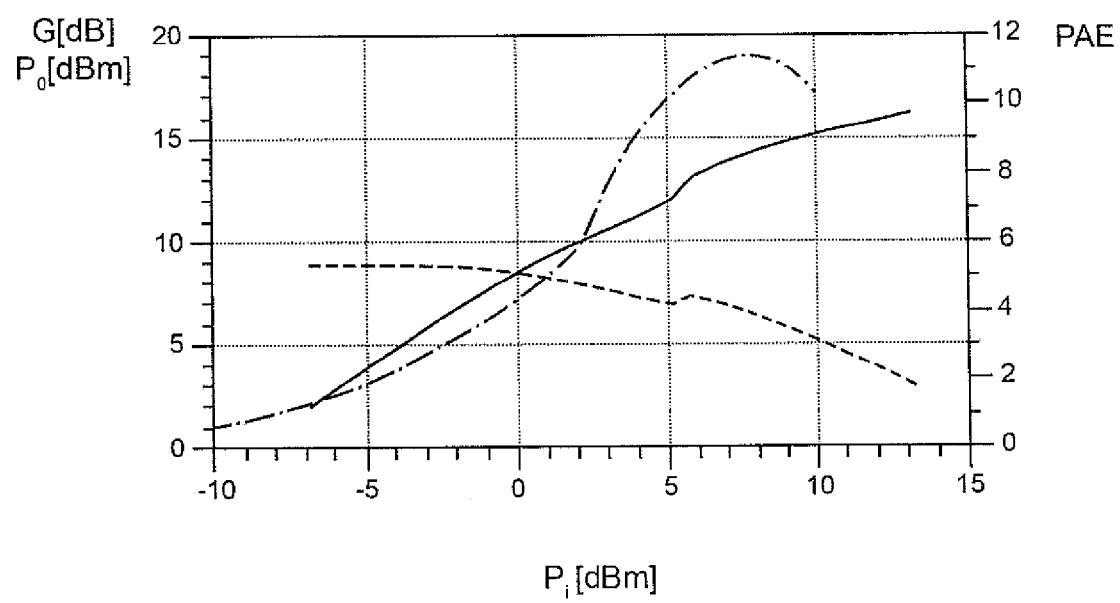
FIG. 5 shows the simulation results for the amplifier of FIG. 4.

FIG. 5 shows, by way of example, the simulation of the performance as to RF power of an RF power amplifier with DDDAT structure formed according to FIGS. 3 and 4 using a standard 65 nm CMOS process using the applicant technology at an operating frequency of 64 GHz. In particular, the solid line indicates the output power PO, the dashed line indicates the gain G and the dashed-and-dotted line indicates the efficiency PAE as a function of the input power. As may be noted, the amplifier 30 has a high performance even at an extremely high frequency (to be compared with the frequency of 2.4 GHz achieved with the known solution described above).

The present invention enables design and physical construction of radiofrequency power amplifiers in CMOS silicon technology, rendering them competitive as to performance and reliability as compared to more costly technologies or solutions that require increasing the number of masks for implementing complex structures or the use of sophisticated GaAs (gallium arsenide) substrates. Instead, with the present amplifier, there are no limitations to the maximum frequencies of use and thus to the potential applications.

Finally, it is clear that modifications and variations may be made to the amplifier described and illustrated herein, without thereby departing from the scope of the present invention, as defined in the annexed claims.

In particular, as indicated above, it is stressed that the represented square shape is not limiting and it is possible to adopt a variety of geometrical shapes. In addition, the input secondaries 36 and the output primaries 46 could be provided on a different metal level, lower or higher with respect to the input primary 35 and to the output secondary 45, respectively. They could be obtained also on metal levels different from one another.

What is claimed is:

1. A power amplifier comprising a plurality of pairs of transistors, each pair comprising a first transistor and a second transistor having each a respective input terminal and a respective output terminal; the output terminals of the first and second transistors of each pair being connected to an output distributed active transformer coupled to a differential output of the power amplifier, wherein the input terminals of the first and second transistors of each pair are connected to an input distributed active transformer coupled to an input of the power amplifier and wherein said input distributed active transformer comprises an input primary element and a plurality of input secondary elements including at least one first input secondary element and one second input secondary element, adjacent to each other, and the input terminal of the first transistor of a pair is coupled to an end of the first input secondary element and the input terminal of the second transistor of said pair is coupled to an end of the second input secondary element and the input primary element faces said plurality of input secondary elements.

2. A power amplifier according to claim 1, wherein said output distributed active transformer comprises a plurality of output primary elements including at least one first output primary element and one second output primary element and the output terminal of the first transistor of a pair is coupled to an end of the first output primary element and the output terminal of the second transistor of said pair is coupled to an end of the second output primary element and the output secondary element faces said plurality of output primary elements.

3. A power amplifier according to claim 2, wherein the input primary element surrounds said plurality of input secondary elements and the plurality of output primary elements surrounds the output secondary element.

4. A power amplifier according to claim 1, wherein said input and output distributed active transformers extend along sides of a first planar geometrical figure and a second planar geometrical figure, coaxially to each other, and said pairs of transistors are coupled near edges of said geometrical figures.

5. A power amplifier according to claim 3, wherein said input primary element is formed by a single metal region extending along the perimeter of a first planar geometrical figure having a side broken at the input of the power amplifier, and said input secondary elements are formed by distinct metal regions each extending parallel and facing a respective side of the first planar geometrical figure.

6. A power amplifier according to claim 4, wherein said input primary element and said output secondary element are formed by metal regions extending in a metal level, the power amplifier further comprising a first power distribution structure extending in a further metal level and coupled to the output distributed active transformer and a second power distribution structure extending in an additional metal level, different from the further metal level, and coupled to the input distributed active transformer.

7. A power amplifier according to claim 6, wherein the first power distribution structure is coupled to the output distributed active transformer through first metal vias and the second power distribution structure is coupled to the input distributed active transformer through second metal vias.

8. A power amplifier according to claim 7, wherein said second power distribution structure extends below the first power distribution structure.

9. A power amplifier according to claim 8, wherein at least some metal vias of said second metal vias extend through said first power distribution structure, insulating regions being interposed between said some second metal vias and said first power distribution structure.

10. A power amplifier according to claim 7, wherein said first and second power distribution structures have a plurality of arms extending transversely to the sides of said first and second geometric figures.

11. A power amplifier according to claim 6, wherein the input and output distributed active transformers are formed in a single metal level.

12. A power amplifier comprising:
a plurality of transistor pairs:
a distributed output transformer including a plurality of output primary elements and an output secondary element, the output primary elements coupled to output terminals of adjacent transistor pairs and magnetically coupled to the output secondary element, the output secondary element coupled to an output to the amplifier; and
a distributed input transformer including an input primary element and a plurality of input secondary elements, the input primary element including a conductive strip having several sides and coupled to the input of the amplifier, the input secondary elements coupled to input terminals of adjacent transistor pairs and magnetically coupled to the input primary element, the input primary element surrounding the plurality of transistor pairs and the distributed output transformer.

13. A power amplifier as defined in claim 12, wherein the input primary element includes a metal strip having several sides and one of the input secondary elements is located adjacent to and inside each of the sides of the input primary element.

14. A power amplifier as defined in claim 12, wherein the input primary element includes a four-sided metal strip having a gap between ends thereof, and four input secondary elements are located adjacent to and inside respective sides of the input primary element.

15. A power amplifier as defined in claim 12, wherein opposite ends of the input secondary elements are coupled to input terminals of adjacent transistor pairs to form a push-pull circuit configuration.

16. A power amplifier as defined in claim 15, wherein the input secondary elements comprise metal strips parallel to respective sides of the input primary element.

17. A power amplifier as defined in claim 12, wherein each input secondary element comprises a metal strip positioned at 90 degrees with respect to adjacent input secondary elements.

18. A power amplifier as defined in claim 12, wherein an intermediate tap of each input secondary element is coupled to a supply voltage.

19. A method for amplifying power, comprising:
dividing an input to a power amplifier using a distributed input transformer including an input primary element and a plurality of input secondary elements, the input primary element including a conductive strip having several sides and coupled to the input of the amplifier;
driving input terminals of a plurality of transistor pairs with the input secondary elements of the distributed input transformer; and
combining outputs of the transistor pairs using a distributed output transformer including a plurality of output primary elements and an output secondary element, the output secondary element coupled to the output of the amplifier.

* * * * *